(12) United States Patent
Adhikari et al.

(10) Patent No.: US 11,164,806 B2
(45) Date of Patent: Nov. 2, 2021

(54) TEMPERATURE CALCULATION BASED ON NON-UNIFORM LEAKAGE POWER

(75) Inventors: Dhananjay Adhikari, Austin, TX (US); Zhong-Ning George Cai, Lake Oswego, OR (US); Jacob Schneider, Austin, TX (US)

(73) Assignee: INTEL CORPORATION, Santa Clara, CA (US)

( * ) Notice: Subject to any disclaimer, the term of this patent is extended or adjusted under 35 U.S.C. 154(b) by 653 days.

(21) Appl. No.: 13/367,870

(22) Filed: Feb. 7, 2012

(65) Prior Publication Data

US 2012/0134385 A1 May 31, 2012

Related U.S. Application Data

(63) Continuation of application No. 11/646,064, filed on Dec. 27, 2006, now abandoned.

(51) Int. Cl.
*H01L 23/34* (2006.01)

(52) U.S. Cl.
CPC ...... *H01L 23/34* (2013.01); *H01L 2924/0002* (2013.01)

(58) Field of Classification Search
CPC ............. H01L 23/34; H01L 2924/00; H01L 2924/0002; G01N 25/72
USPC ............................................. 702/130; 374/4
See application file for complete search history.

(56) References Cited

U.S. PATENT DOCUMENTS

| | | | | |
|---|---|---|---|---|
| 3,781,814 A | * | 12/1973 | Deerfield | G06F 9/30145 712/200 |
| 5,961,215 A | * | 10/1999 | Lee et al. | 374/178 |
| 6,006,996 A | * | 12/1999 | Bhatnagar | G05D 23/1902 236/46 R |
| 6,535,798 B1 | | 3/2003 | Bhatia et al. | |
| 6,606,729 B2 | | 8/2003 | Gross et al. | |
| 6,674,623 B1 | * | 1/2004 | Abe | G06F 1/206 257/E23.08 |
| 6,842,714 B1 | * | 1/2005 | Acar et al. | 702/136 |
| 7,347,621 B2 | | 3/2008 | Sri-Jayantha et al. | |
| 7,400,945 B2 | * | 7/2008 | Radhakrishnan et al. | 700/299 |
| 2003/0020132 A1 | * | 1/2003 | Cornett | H01L 27/0605 257/468 |

(Continued)

OTHER PUBLICATIONS

L. He, et al., "System level leakage reduction considering the interdependence of temperature and leakage", DAC'04 Jun. 7-11, 2004.*

(Continued)

*Primary Examiner* — Arleen M Vazquez
*Assistant Examiner* — Brandon J Becker
(74) *Attorney, Agent, or Firm* — Schwabe, Williamson & Wyatt, P.C.

(57) ABSTRACT

A system may include determination of a spatial power map associated with an integrated circuit based on an architecture of the circuit, generation of a spatial thermal map associated with the integrated circuit based on the spatial power map, and determination of a spatial leakage power map based on the spatial thermal map. In some aspects, a system includes determination of a temperature of an integrated circuit, comparison of the temperature with a thermal divergence temperature, determination that the temperature of the integrated circuit is primarily due to leakage power, and disabling of power to the integrated circuit.

23 Claims, 4 Drawing Sheets

(56) References Cited

U.S. PATENT DOCUMENTS

| | | | | |
|---|---|---|---|---|
| 2004/0103330 | A1* | 5/2004 | Bonnett | 713/322 |
| 2004/0128101 | A1* | 7/2004 | Hermerding, II | 702/136 |
| 2004/0179576 | A1* | 9/2004 | Bowden et al. | 374/163 |
| 2005/0149772 | A1* | 7/2005 | Chung | G06F 1/206 713/320 |
| 2006/0025897 | A1* | 2/2006 | Shostak | B60C 23/005 701/1 |
| 2006/0031794 | A1 | 2/2006 | Li et al. | |
| 2007/0005152 | A1* | 1/2007 | Karr | G06F 1/28 700/22 |
| 2007/0211512 | A1* | 9/2007 | Shuto | G11C 7/04 365/145 |
| 2007/0262754 | A1* | 11/2007 | Burton | 323/211 |
| 2008/0040408 | A1* | 2/2008 | Wyatt et al. | 708/204 |
| 2008/0056049 | A1* | 3/2008 | Moyer | G11C 5/147 365/227 |
| 2009/0262468 | A1* | 10/2009 | Ide | H02M 1/32 361/18 |

OTHER PUBLICATIONS

Non-Final Office Action dated Sep. 21, 2009 for U.S. Appl. No. 11/646,064, (Sep. 21, 2009).
Final Office Action dated Apr. 2, 2010 for U.S. Appl. No. 11/646,064, (Apr. 2, 2010).
Advisory Action dated Jun. 4, 2010 for U.S. Appl. No. 11/646,064.
Non-Final Office Action dated Jul. 20, 2010 for U.S. Appl. No. 11/646,064.
Final Office Action dated Jan. 3, 2011 for U.S. Appl. No. 11/646,064.
Non-Final Office Action dated Mar. 2, 2011 for U.S. Appl. No. 11/646,064.
Final Office Action from U.S. Appl. No. 11/646,064 dated Aug. 3, 2011, 22 pages.
Choi, J. et al., "Leakage Power Dependent Temperature Estimation to Predict Thermal Runaway in FinFET Circuits", Nov. 2006, ACM, pp. 583-856.
He, Lei et al., "System Level Leakage Reduction Considering the Interdependence of Temperature and Leakage", DAC Jun. 7-11, 2004; San Diego, CA, USA; Copyright ACM 2004, pp. 12-17.
Ku, J. et al., "Thermal Management of On-Chip Cashes Through Power Density Minimization", CUCIS Northwestern University, pp. 1-21, 2005.
Li, Peng et al., "Temperature-Dependent Optimization of Cache Leakage Power Dissipation", Proceedings of the 2005 Int'l Conference on Computer Design (ICCD '05); IEEE 2005, pp. 1-6.
Advisory Action received for U.S. Appl. No. 11/646,064, dated Sep. 30, 2011, 3 Pages.

* cited by examiner

TEMPERATURE CALCULATION BASED ON NON-UNIFORM LEAKAGE POWER

CLAIM OF PRIORITY

The present patent application is a Continuation of, and claims priority to and incorporates by reference in its entirety, the corresponding U.S. patent application Ser. No. 11/646,064 entitled, "TEMPERATURE CALCULATION BASED ON NON-UNIFORM LEAKAGE POWER" filed on Dec. 27, 2006.

BACKGROUND

Power dissipation directly affects the performance and reliability of modern integrated circuits. A microprocessor designer, for example, may model this power dissipation with respect to a high level micro-architecture, a register transfer level, and an actual implementation of the microprocessor. According to conventional methods for modeling power dissipation, source-to-drain leakage power is characterized as a constant depending only on a process corner of the subject integrated circuit. These methods typically neglect any dependence of leakage power on temperature as insignificant.

DETAILED DESCRIPTION

Figure 1:
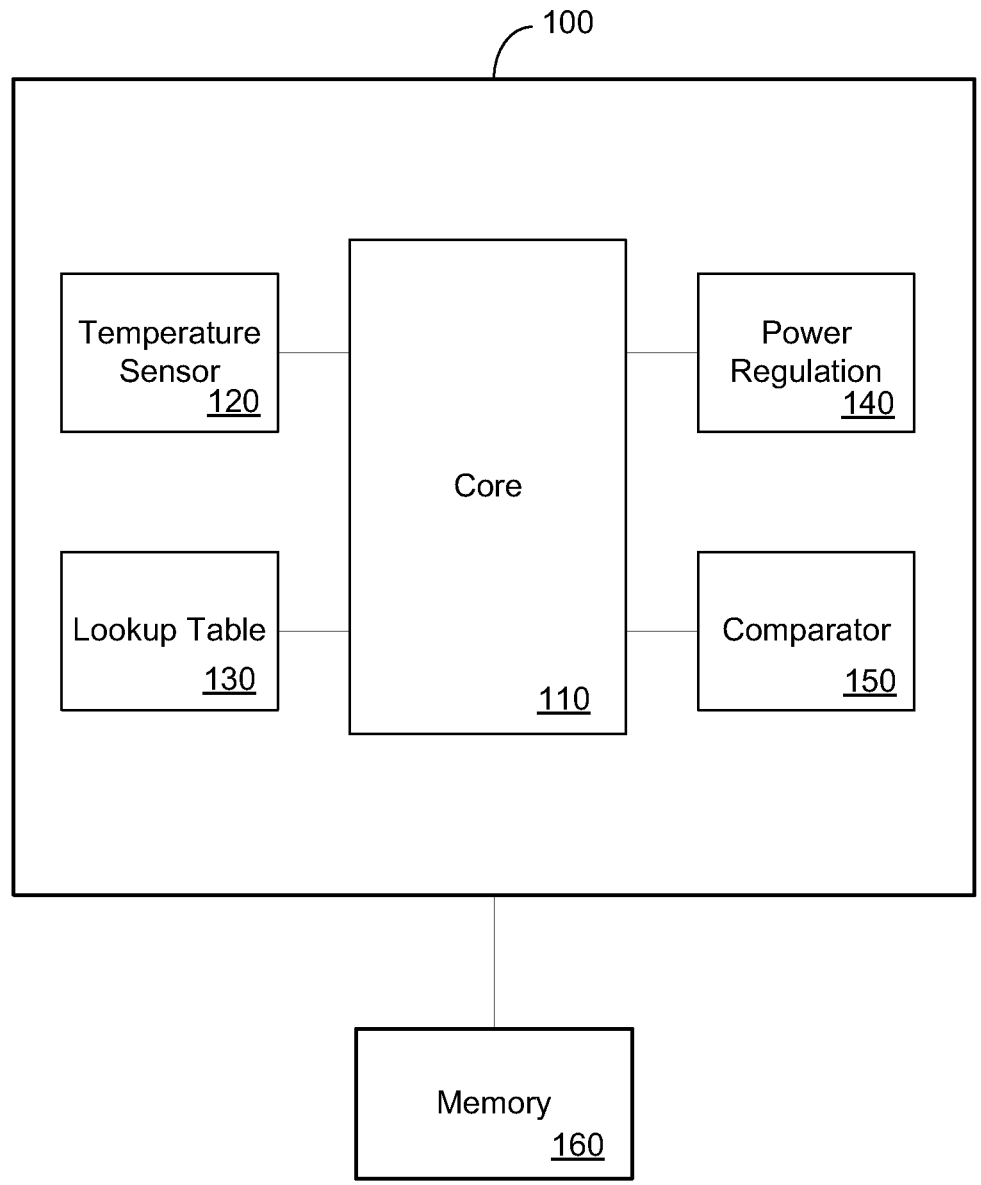
FIG. 1 is a block diagram illustrating an apparatus according to some embodiments.

FIG. 1 is a block diagram of integrated circuit 100 according to some embodiments. Integrated circuit 100 may comprise any type of semiconductor-based device having electrical devices integrated therein. Integrated circuit 100 may be fabricated according to any number of fabrication techniques that are or become known. In some embodiments, integrated circuit 100 comprises a silicon-based general-purpose microprocessor.

Integrated circuit 100 comprises core 110, temperature sensor 120, lookup table 130, power regulation circuit 140 and comparator 150. The positions and relative sizes of functional blocks 110 through 150 do not necessarily reflect any particular implementation. According to some embodiments, one or more of functional blocks 110 through 150 may share active or passive electrical elements amongst each other.

Core 110 may comprise an execution engine to execute processor-executable program code. Such execution may illicit desired behavior from circuit 100, which may include internal state changes as well the driving of desired signals to external pins (not shown) of circuit 100. Circuit 100 may store program code "on-chip" for low-level operations such as one or more processes described herein.

Memory 160 may be in communication with one or more external pins and may provide processor-executable program code to integrated circuit 100 according to some embodiments. Memory 160 may comprise any type of memory for storing data, including but not limited to a Single Data Rate Random Access Memory (SDR-RAM), a Double Data Rate Random Access Memory (DDR-RAM), or a Programmable Read Only Memory (PROM).

Figure 2:
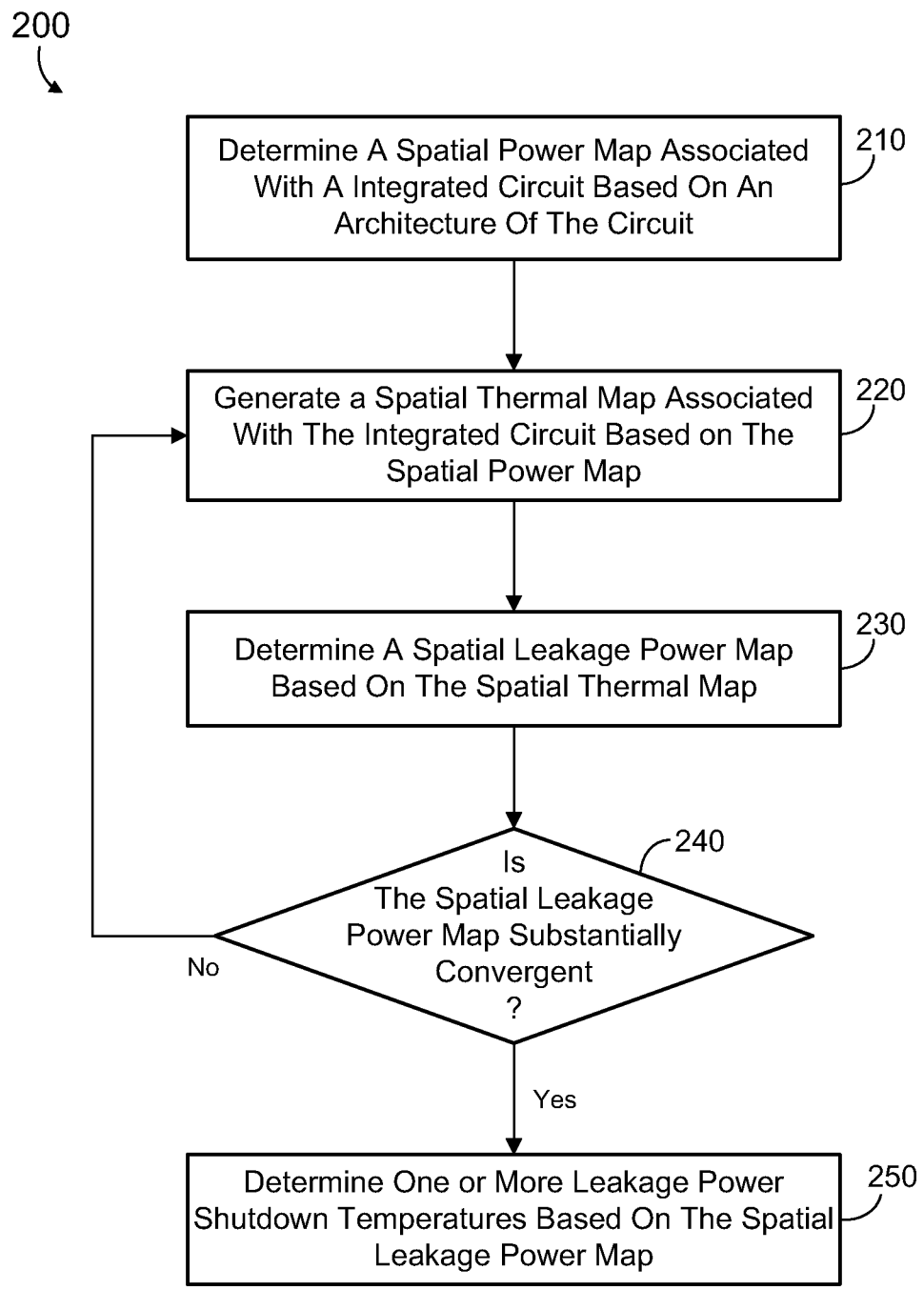
FIG. 2 is a flow diagram of a process according to some embodiments.

FIG. 2 is a diagram of process 200 according to some embodiments. Process 200 may be executed by any combination of hardware, software and/or firmware, and some elements may be executed manually. Process 200 may be executed during testing and/or other quality assurance activities after manufacture of an integrated circuit.

Initially, at 210, a spatial power map associated with an integrated circuit is determined. The spatial power map is based on an architecture of the circuit. Determination of the spatial power map at 210 may proceed according to any suitable system that is or becomes known. For example, some conventional systems receive an electronic "floorplan" of the integrated circuit, statistical historic studies of prior integrated circuits, and process data, and generate a three-dimensional map illustrating power consumption at various locations throughout the integrated circuit. The map typically reflects active power, gate power, and source-to-drain leakage power.

Next, at 220, a spatial thermal map associated with an integrated circuit is generated based on the spatial power map generated at 210. The spatial thermal map may indicate average operational temperatures at various points of the integrated circuit. Again, current or future conventional methods for generating such a thermal map may be employed at 220.

A spatial leakage power map is determined at 230 based on the spatial thermal map generated at 220. According to some embodiments, the spatial leakage power map reflects source-to-drain leakage power at various locations of the integrated circuit. The leakage power may be modeled as follows:

$$P_{sdleak2} = P_{sdleak1} e^{\beta(T2-T1)},$$

where $\beta$ is obtained from process data simulations. The following table illustrates values of $\beta$ generated by SPICE measurements using a minimum square fit method, with $V_{dd}$=1.1V, T=25 to 150 degrees C., and a PTTTT skew on conventional microprocessor fabrication process.

|        | TTTT     | FFFF     |
|--------|----------|----------|
| $LV_T$ NMOS | 1.48E−02 | 9.35E−02 |
| $HV_T$ NMOS | 1.94E−02 | 1.68E−02 |
| $LV_T$ PMOS | 1.76E−02 | 1.06E−02 |
| $HV_T$ PMOS | 2.01E−02 | 1.74E−02 |

As shown, $\beta$ may vary depending on process corner. Accordingly, several spatial leakage power maps corresponding to respective process corners may be generated at 230.

At 240, it is determined whether the spatial leakage power map is substantially convergent. Convergence in this context may indicate that a difference between the most-recently determined spatial thermal map and a previously-determined thermal map is less than a predetermined threshold. Some embodiments therefore require flow to return to 220 and continue as described above to generate a second spatial thermal map for comparison against a first spatial thermal map at 240. Flow continues to cycle between 220, 230 and 240 until the most-recently determined spatial thermal map is determined to be substantially convergent.

One or more leakage power shutdown temperatures are determined at 250 based on the spatial leakage power map. The determination at 250 may be based on the direct proportionality of temperature to total power, written as $T_j=T_a+f$ (Source-Drain Leakage Power, Gate Leakage Power, Active Power). Assuming that $Y_1=T_j$ and $Y_2=T_a+f$ (Source-Drain Leakage Power, Gate Leakage Power, Active Power), the function $Y=Y_1-Y_2$ may be defined. The function Y has one minimum and no maximums. Moreover, if the minimum is less than 0, either one solution (i.e., a converging case) or two solutions (i.e., a diverging case) exists.

Figure 3:
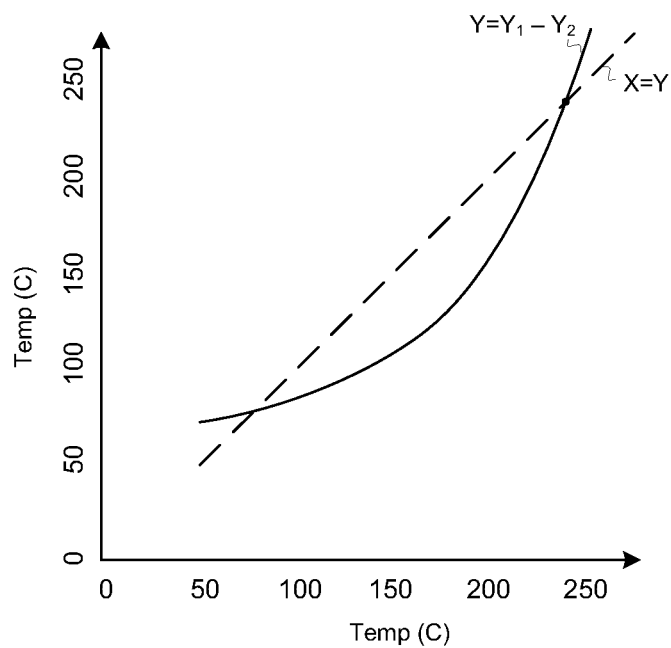
FIG. 3 illustrates a thermal divergence temperature determined according to some embodiments.

FIG. 3 is a graph illustrating a plot of Y according to some embodiments. The plot is associated with a particular process corner based on which the associated spatial leakage power map was determined at 230. Also shown is solution A of the function Y, which may represent a leakage power shutdown temperature according to some embodiments. The leakage power shutdown temperature may be a temperature at which, for the given process corner, temperature and leakage power become self-reinforcing and cause a runaway condition.

Figure 4:
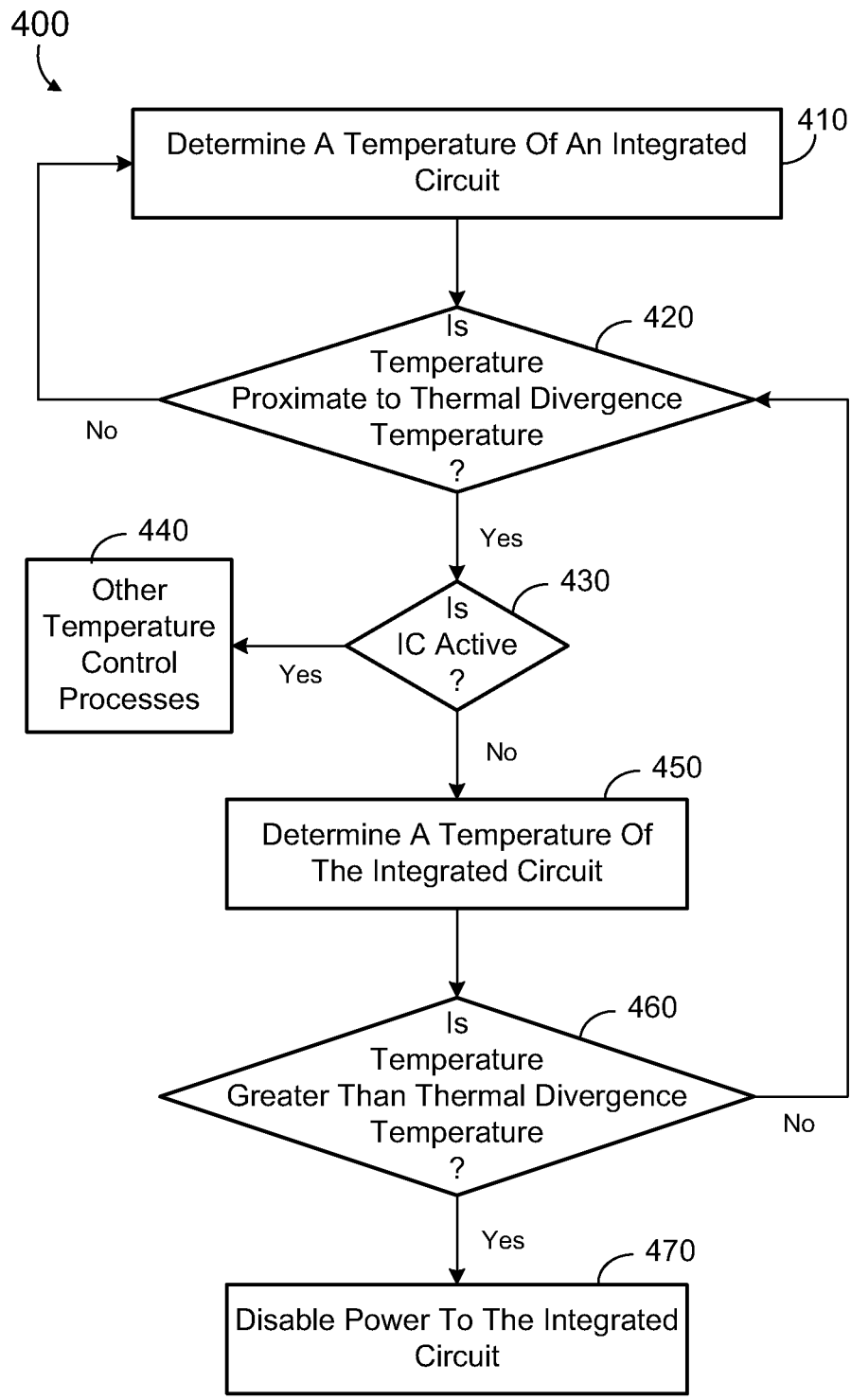
FIG. 4 is a flow diagram of a process according to some embodiments.

FIG. 4 is a flow diagram of process 400 according to some embodiments. Process 400 may be executed by any combination of hardware, software and/or firmware. Process 400 may be executed by circuit 100 according to some embodiments.

A temperature of an integrated circuit is determined at 410. The temperature may be determined by an on-chip temperature sensor such as temperature sensor 120, which may comprise a digital thermometer or any other type of sensor that is or becomes known. The sensor may measure the temperature at a particular location of the integrated circuit at which temperature and leakage power are of concern.

At 420, it is determined whether the temperature is proximate to a thermal divergence temperature. As described above with respect to the leakage power shutdown temperature, the thermal divergence temperature may be a temperature at which the continued application of supply power may cause a runaway temperature condition. Accordingly, the thermal divergence temperature may be determined for a particular location of the integrated circuit as described above with respect to the leakage power shutdown temperature.

The thermal divergence temperature may be stored on-chip (e.g., in lookup table 130) after manufacture of the integrated circuit. In some embodiments, several thermal divergence temperatures are stored on-chip and one of the stored temperatures is flagged to indicate its applicability to the particular integrated circuit. Such an arrangement may allow a manufacturer to customize process 400 in view of a process corner or intended use of the integrated circuit.

Comparator 150 may compare the determined temperature to the thermal divergence temperature at 420. Comparator 150 may indicate TRUE if the measured temperature is less than but sufficiently proximate to the thermal divergence temperature. Comparator 150 may be an element of core 110. Flow returns to 410 if the determined temperature is not proximate to the thermal divergence temperature.

Flow proceeds to 430 if the determination at 420 is affirmative. At 430, it is determined if the integrated circuit is active. The determination at 430 may be intended to determine if the measured temperature is primarily due to active power or leakage power. The determination may be based on communication with the operating system, internal performance counters of the integrated circuit, etc. If the integrated circuit is active, flow continues to 440 to hand control to other temperature control processes. Such control may comprise reducing operational frequency, supply power, workload, etc.

If it is determined that the integrated circuit is not active, a temperature of the integrated circuit is again determined at 450, and this temperature is compared against the thermal divergence point at 460. If the measured temperature is less than the thermal divergence point, flow returns to 420 to determine whether to determine whether the temperature of the integrated circuit is still proximate to the thermal divergence temperature and flow continues as described above.

If the measured temperature is greater than the thermal divergence point at 460, power to the integrated circuit is disabled at 470. Disabling the power is intended to prevent a runaway temperature condition. The power may be disabled by operating power regulation circuit 140 to reduce or eliminate power supplied to all or a portion of integrated circuit 100. The power may be disabled at 470 by instructing an off-chip voltage regulator (not shown) to stop power delivery to integrated circuit 100.

The several embodiments described herein are solely for the purpose of illustration. Therefore, persons in the art will recognize from this description that other embodiments may be practiced with various modifications and alterations.

What is claimed is:

1. An integrated circuit comprising:
    a processing core;
    a temperature sensor to determine a first temperature of the processing core;
    a lookup table to store a temperature value which is a thermal divergence temperature, wherein the thermal divergence temperature is a temperature at which continued application of supply power causes a runaway temperature condition; and
    a hardware comparator circuit to compare the first temperature of the processing core with the stored temperature value, wherein the hardware comparator circuit is positioned in the processing core.

2. The integrated circuit of claim 1, wherein the temperature sensor comprises a digital thermometer.

3. The integrated circuit of claim 1, wherein the temperature sensor is positioned at a location where leakage power is higher than other locations in the processing core.

4. The integrated circuit of claim 1, wherein the lookup table is operable to store a plurality of temperature values, wherein at least one of the temperature values from the plurality of temperature values is flagged to indicate applicability of the temperature value to the integrated circuit.

5. The integrated circuit of claim 1, further comprising a power regulator which is operable to reduce a power supply level to the processing core or eliminate power supply to the processing core according to an output signal from the hardware comparator circuit.

6. The integrated circuit of claim 5, wherein the power regulator is operable to eliminate power supply to the processing core when an off-chip voltage regulator instructs the power regulator to stop power delivery.

7. The integrated circuit of claim 1, wherein the temperature sensor is to determine the first temperature of the processing core due to leakage power when the processing core is inactive.

8. The integrated circuit of claim 7, wherein the determination that the processing core is inactive is made via an operating system.

9. The integrated circuit of claim 7, wherein the temperature sensor is to determine a second temperature of the processing core after it is determined that the temperature of the processing core is due to leakage power, and wherein the integrated circuit is to determine whether the second temperature is greater than the temperature value.

10. A system comprising:
a memory;
an integrated circuit, coupled to the memory, comprises:
   a processing core;
   a temperature sensor to determine a temperature of the processing core;
   a lookup table to store a temperature value which is a thermal divergence temperature, wherein the thermal divergence temperature is a temperature at which continued application of supply power causes a runaway temperature condition; and
   a hardware comparator circuit to compare the temperature of the processing core with the stored temperature value, wherein the hardware comparator circuit is positioned in the processing core; and
an operating system to indicate whether the processing core in the integrated circuit is active.

11. The system of claim 10, wherein the memory is at least one of:
Double Data Rate (DDR) Random Access Memory (RAM);
Single Data Rate (SDR) RAM; or
Programmable Read Only Memory (PROM).

12. The system of claim 10, wherein the processing core comprises an execution engine to illicit behavior of the integrated circuit.

13. The system of claim 10, wherein the temperature sensor comprises a digital thermometer.

14. The system of claim 10, wherein the temperature sensor is positioned at a location where leakage power is higher than other locations in the processing core.

15. The system of claim 10, wherein the integrated circuit further comprises a power regulator which is operable to reduce a power supply level to the processing core or eliminate power supply to the processing core according to an output signal from the hardware comparator circuit.

16. The system of claim 15, further comprising a voltage regulator external to the integrated circuit which is operable to instruct the power regulator to stop power delivery according to the output signal from the hardware comparator circuit.

17. The integrated circuit of claim 1, wherein the hardware comparator circuit is to indicate a TRUE output if the temperature is less than the thermal divergence temperature.

18. The integrated circuit of claim 1, wherein the temperature sensor is to determine a second temperature of the processing core due to leakage power when the processing core is determined to be inactive.

19. The integrated circuit of claim 1, wherein the processing core comprises one or more performance counters to determine whether the integrated circuit is active.

20. The integrated circuit of claim 19, comprising logic to reduce workload if it is determined that the integrated circuit is active.

21. An integrated circuit comprising:
a processing core;
a temperature sensor to determine a first temperature of the processing core, while the processing core is inactive;
a lookup table to store a temperature value which is a thermal divergence temperature; and
a hardware comparator circuit to compare the first temperature of the processing core with the stored temperature value, and to determine that the first temperature of the processing core is proximate to and less than the stored temperature value,
wherein subsequent to the comparison of the first temperature with the stored temperature value and while the processing core is inactive, the temperature sensor is to determine a second temperature of the processing core,
wherein the hardware comparator circuit is to compare the second temperature of the processing core with the stored temperature value, and
wherein in response to the second temperature of the processing core being more than the stored temperature value, power to one or more sections of the integrated circuit is to be disabled.

22. The integrated circuit of claim 21, wherein:
the hardware comparator circuit is positioned in the processing core; and
the thermal divergence temperature is a temperature at which continued application of supply power causes a runaway temperature condition.

23. The integrated circuit of claim 1, wherein:
the temperature sensor is to determine the first temperature of the processing core, while the processing core is inactive;
the hardware comparator circuit is to determine that the first temperature of the processing core is proximate to and less than the thermal divergence temperature;
subsequent to and in response to the hardware comparator circuit determining that the first temperature of the processing core is proximate to and less than the thermal divergence temperature, the temperature sensor is to determine a second temperature of the processing core, while the processing core is inactive;
the hardware comparator circuit is to determine that the second temperature of the processing core is higher than the thermal divergence temperature; and
in response to the second temperature of the processing core being more than the thermal divergence temperature, power to one or more sections of the integrated circuit is to be disabled.

* * * * *